United States Patent [19]
Bloom

[11] Patent Number: 5,569,958
[45] Date of Patent: Oct. 29, 1996

[54] ELECTRICALLY CONDUCTIVE, HERMETIC VIAS AND THEIR USE IN HIGH TEMPERATURE CHIP PACKAGES

[75] Inventor: Terry R. Bloom, Middlebury, Ind.

[73] Assignee: CTS Corporation, Elkhart, Ind.

[21] Appl. No.: 249,813

[22] Filed: May 26, 1994

[51] Int. Cl.⁶ .............................. H01B 17/26; H01H 1/02
[52] U.S. Cl. .................... 257/698; 257/703; 257/762; 174/265; 228/124.5
[58] Field of Search .................................. 257/705, 774, 257/764, 741, 698, 762; 174/263, 265, 267, 262, 261, 50.61; 228/124.5

[56] References Cited

U.S. PATENT DOCUMENTS

| | | |
|---|---|---|
| 2,570,248 | 1/1951 | Kelley . |
| 2,857,663 | 10/1958 | Beggs . |
| 3,665,592 | 5/1972 | Apospors . |
| 3,915,369 | 10/1975 | Schmidt-Bruecken et al. . |
| 4,684,579 | 8/1987 | Mizuhara . |
| 4,695,517 | 9/1987 | Okuno et al. . |
| 4,729,504 | 3/1988 | Edamura . |
| 4,775,414 | 10/1988 | Shoji . |
| 4,835,344 | 5/1989 | Iyogi et al. . |
| 4,901,904 | 2/1990 | Tsuno . |
| 4,917,642 | 4/1990 | Nakahashi et al. . |
| 4,924,033 | 5/1990 | Iyogi et al. . |
| 4,938,922 | 7/1990 | Mizuhara . |
| 4,961,529 | 10/1990 | Gottselig et al. . |
| 5,013,612 | 5/1991 | Hunt et al. . |
| 5,019,187 | 5/1991 | Iyogi et al. . |
| 5,104,747 | 4/1992 | Makino et al. . |
| 5,184,399 | 2/1993 | Ueno et al. . |
| 5,189,507 | 2/1993 | Carlomagno et al. . |
| 5,198,265 | 3/1993 | Iacovangelo et al. . |
| 5,200,249 | 4/1993 | Dolhert et al. . |
| 5,229,213 | 7/1993 | Horiuchi et al. . |
| 5,283,104 | 2/1994 | Aoude et al. .............................. 428/195 |
| 5,368,220 | 11/1994 | Mizuhara et al. .................... 228/124.5 |
| 5,422,190 | 6/1995 | Alexander .............................. 428/552 |

OTHER PUBLICATIONS

Humpston, G. and Jacobson, D., "Principals of Soldering and Brazing", *ASM Int.*, p. 164, 1993; and Schwartz, M., 'Brazing', *ASM Int.*, p. 120, 1987.

H. Mizuhara and R. Huebel, "Joining Ceramic to Metal with Ducitile Active Filler Metal", Welding Journal, Oct. 1986, pp. 43–51.

H. Mizuhara, "Vacuum Brazing Ceramics to Metals", Advanced Materials & Processes, Inc. Metal Progress, Feb. 1987, pp. 53–55.

R. W. Harshbarger, W. K. Jones, W. Jiang, R. Zhug, "Evaluation Of Braze Processes For AlN Packages", The International Journal for Hybrid Microelectronics, vol. 14, No. 1, Mar. 1991, PP.11–22.

Terry R. Bloom, "Aluminum Nitride Package For 300° C Operation", Presented at 1993 Proceedings of the 43rd Electronic Components and Technology Conference, Orlando, Florida, USA, Electronic Components and Technology Conference 1993, Published by IEEE, IEEE Service Center, Piscataway, NJ, USA, 1993, pp.431–435.

Terry R. Bloom, "The Reliability Of AlN Power Hybrids Using Cu Thick Film Conductive", 1990 Proceedings of the 40th Electronic Components and Technoloy Conference (May 20, 1990) Las Vegas, NV, USA, Electronics Components Conference published by IEEE, 1990, pp. 111–115.

(List continued on next page.)

*Primary Examiner*—Donald Monin
*Attorney, Agent, or Firm*—Pearne, Gordon, McCoy & Granger

[57] ABSTRACT

Hermetically sealed chip packages are described which are capable of withstanding elevated temperatures and accompanying temperature fluctuations. The chip packages feature electrically conductive, hermetic vias which provide electrical pathways through generally dielectric ceramic substrates employed in the chip package. Methods of forming such hermetic vias are also disclosed.

16 Claims, 5 Drawing Sheets

OTHER PUBLICATIONS

J. Guinet, J. P. Michelet, J. Jarrig, J. Mexmain, "Characterization Of Copper Bonded AlN Substrates By Active Metal Brazing", IMC 1992 Proceedings, Yokohama, Jun. 3–Jun. 5, 1992, pp. 464–469.

A. Shibuya, Y. Kurokawa and Y. Shimada, "Highly Thermal Conductive AlN PGA Package", IMC 1992 Proceedings, Yokohama, Jun. 3–Jun. 5, 1992, pp. 285–290.

N. Anderson, S. Weinshanker, "Brazing Of Aluminum Nitride", The International Journal for Hybrid Microelectronics, vol. 14, No. 4, Dec. 1991, pp. 121–128.

Y. Watabe, F. Matsumoto, S. Iwata and T. Ohno, "AlN Thick–Film Metallized Substrate", IMC 1992 Proceedings, Yokohama, Jun. 3–Jun. 5, 1992, pp. 349–354.

Lucas–Milhaupt, Inc., "Lucanex Brazing Pastes For Bonding, Joining or Coating of Ceramics and Other Hard to Wet Materials", Technical Data Sheet–Lucanex, (not dated) 6 pp.

M. G. Nicholas, D. A. Mortimer, L. M. Jones, R. M. Crispin, "Some Observations on the Wetting and Bonding of Nitride Ceramics", Journal of Materials Science 25, (1990) pp. 2679–2689.

ASM Engineered Materials Handbook, "Ceramics and Glasses", vol. 4, 1991, pp. 504–510.

R. E. Loehman, "Joining and Bonding Mechanisms In Nitrogen Ceramics", MRS Int'l. Mtg on Adv. Mats., vol. 8, 1989 Materials Research Society, pp. 3–16.

Masako Nakahashi, Makoto Shirokane and Hiromitsu Takeda, "Characterization of Nitride Ceramic–Metal Joints Brazed with Ti Containing Alloys", J. Japan Inst. Metals, vol. 53, No. 11 (1989), pp. 1153–1160 (untranslated).

W. B. Balder and R. G. Driscoll, "Pin–Brazing Apparatus With Thermal Gas Pin–Preloading System", IBM Corp., IBM Technical Disclosure Bulletin, vol. 26, No. 8, Jan. 1984, 2 pp.

WESGO Division, GTE Products Corporation, "High Purity Low Vapor Pressure Brazing Alloys", WESGO GTE Technical Ceramics and Metals, (not dated) 12 pp.

W. Weise, W. Malikowski and W. Böhm, "Active Brazing Alloys", Technical Library, Degussa Metz Metallurgical Corporation, West Germany, (not dated) 4 pp.

Lucas–Milhaupt, Inc. "Lucanex Brazing Pastes For Bonding, Joining or Coating of Ceramics and Other Hard to Wet Materials", Bulletin LS–188, (not dated) 2 pp.

Geschäftsgegiet Löttechnik Anwendungstechnik, Degussa, "Brazing of Ceramics", (not dated) 32 pp.

Lucas–Milhaupt, Inc., "Handy Flow Brazing/Soldering Paste Alloys", Bulletin PA–Dec. 1989, 4 pp.

C. Van Dyke, "Importance of Proper Fluxing For Silver Brazing", Lucas–Milhaupt, Inc., Article Reprint From Modern Applications News Magazine, Dec. 1984, 4 pp.

Lucas–Milhaupt, Inc. "Brazing/Soldering Filler Metals", Bulletin BA–188, (not dated) 4 pp.

"Fusion Ceramic Brazing with Fusion Paste Alloys", (not dated) 1 p.

H. Mizuhara and K. Mally, "Ceramic–to–Metal Joining with Active Brazing Filler Metal", Welding Journal, Oct. 1985, pp. 27–32.

Humpston, G. and Jacobson, D., "Principals of Soldering and Brazing", *ASM Int.*, p. 164, 1993; and Schwartz, M., 'Brazing', *ASM Int.*, p. 120, 1987.

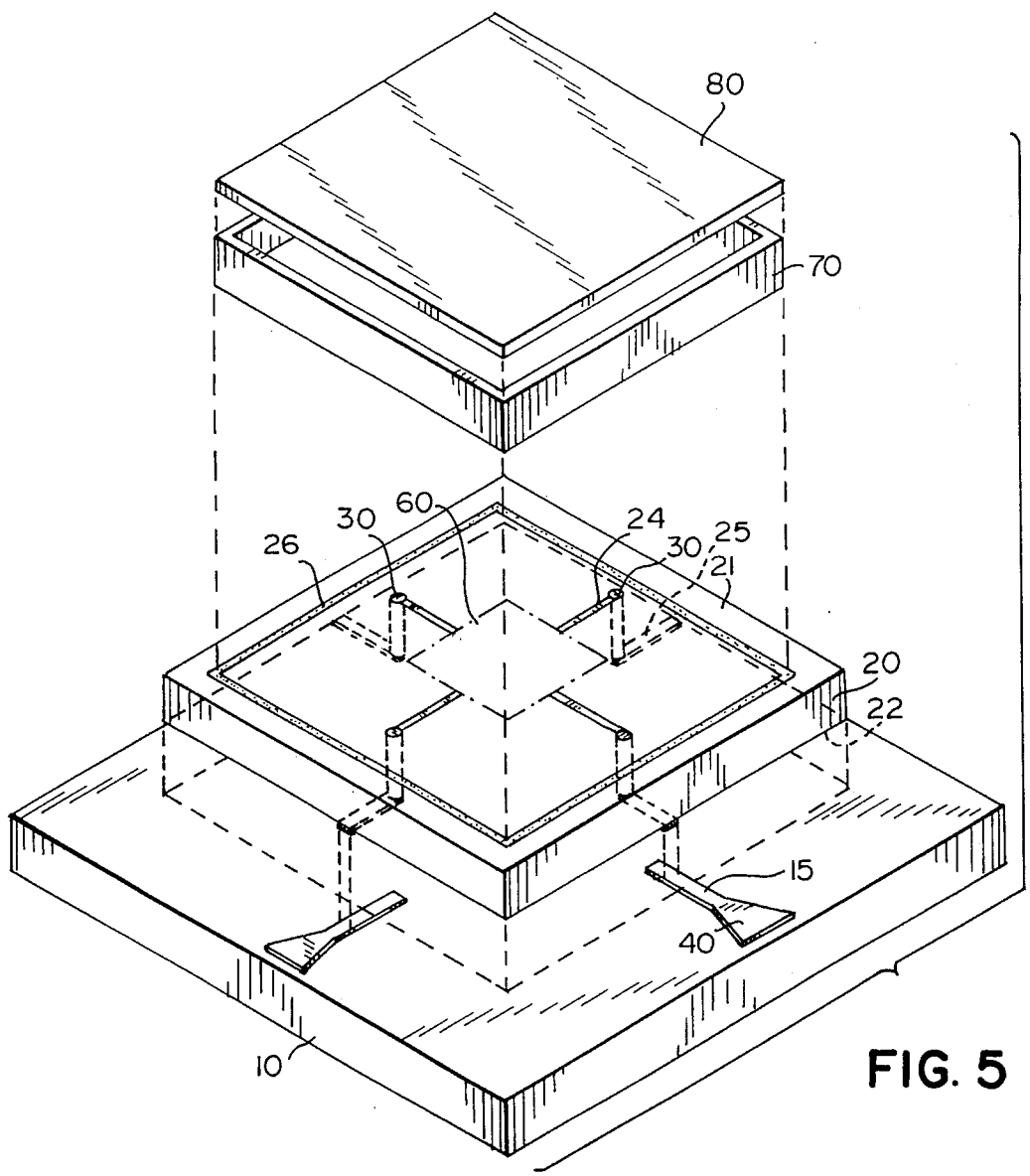
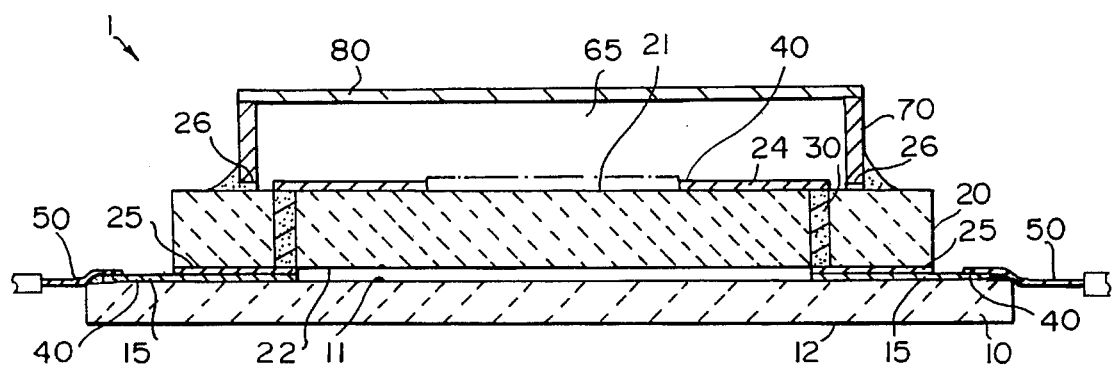
FIG. 5
FIG. 4

ELECTRICALLY CONDUCTIVE, HERMETIC VIAS AND THEIR USE IN HIGH TEMPERATURE CHIP PACKAGES

BACKGROUND OF THE INVENTION

The present invention relates to electrically conductive, hermetic vias and the formation of such vias in hermetically sealed IC chip packages and the like. There are a wide array of high temperature applications for electronic components. Such applications include deep well drilling sensors and engine control units. The latter category of applications is one of the fastest growing areas of high temperature electronics. Electronic engine controllers are often mounted very close to or directly upon the engine itself in order to minimize the number of leads, plugs, connectors and pins between engine and controller, thus subjecting the electronics to the high temperature of the engine. Chip packages are commonly utilized to enclose the fragile electronic component or IC chip, and so must be able to withstand the often harsh environments in which they are placed.

Chip packages typically utilize ceramic substrate bases. The ceramic substrates contain circuit traces printed on one or more of their surfaces for providing electrical connection between the chip within the package and the package exterior. Electrically conductive pathways or vias are provided which extend through the thickness of one or more of the ceramic bases. Vias may be formed in a ceramic substrate by providing a passage or opening extending through the thickness of the substrate and filling with an electrically conductive filler material. Vias may provide an electrical pathway between different levels of circuit traces disposed on ceramic substrates in the package or provide electrical connection through a substrate to the package interior.

It is desirable that the chip package be completely and reliably hermetically sealed so that all foreign materials, such as dust particles, gases and liquids, are prevented from contacting the chip contained within the package. To achieve such hermeticity, it is necessary to provide a sealed enclosure around the chip to prevent leakage between the interior and exterior of the package. One possible path of leakage is through the vias since such vias often extend along the entire thickness of the base of the chip package.

Exposure to temperatures as high as 500° C. and the temperature cycling incident to reaching such high temperatures presents a major threat to the hermeticity of a chip package especially at vias. In addition large temperature deviations, even at relatively low temperatures such as a temperature fluctuation from −65° C. to 300° C., induce extreme thermal expansion or contraction of the ceramic substrate and via fill material and may cause degradation or complete seal failure of the package at the vias. Expansion effects from temperature changes often cause stress induced fracture at or near the via, loss of seal integrity at the via and bond failure between the via fill material and substrate material.

Prior artisans have attempted to form hermetic vias. One such approach, as in U.S. Pat. No. 5,200,249 to Dolhert el al., attempts to match the thermal expansion properties of the via fill material to those of the chip substrate. That approach relies on incorporating particles of the substrate material in the via fill material to approximate the thermal expansion properties of the substrate That approach is undesirable in view of the additional processing steps and related costs in forming the via fill material. Moreover, the addition of particles of substrate material, which is often a dielectric, adversely affects the electrical characteristics of the fill material for chip package vias. Thus, there is a need for an electrically conductive, hermetic via which is capable of withstanding relatively high temperatures and accompanying large temperature fluctuations without loss of hermeticity.

SUMMARY OF THE INVENTION

The present invention provide a substrate with an electrically conductive, hermetic via extending across the thickness of the substrate. The invention provides a via that is capable of maintaining its hermeticity subsequent to and during exposure of the substrate and via to elevated temperatures. Preferably, the invention includes an electronic component base with a via fill composition that is capable of deforming to accommodate dimensional changes in both the base and fill composition without loss of hermeticity, which occur as a result of heating to elevated temperatures. Preferably this composition includes an effective amount of an appropriate metal, up to about 10% of at least one active agent and an organic vehicle. The invention also provides hermetic chip packages utilizing substrates with such vias, which are adapted for exposure to such temperatures. In addition, the invention provides methods of forming electrically conductive, hermetic vias. The present invention is of significant importance to high temperature applications for electronic components since hermetic enclosures may now be provided for such electronics.

BRIEF DESCRIPTION OF THE DRAWINGS

FIG. 4 is a cross-sectional view of the chip package depicted in FIG. 1;

FIG. 5 is an exploded view of the chip package depicted in FIG. 1;

DETAILED DESCRIPTION OF THE PREFERRED EMBODIMENTS

Figure 1:
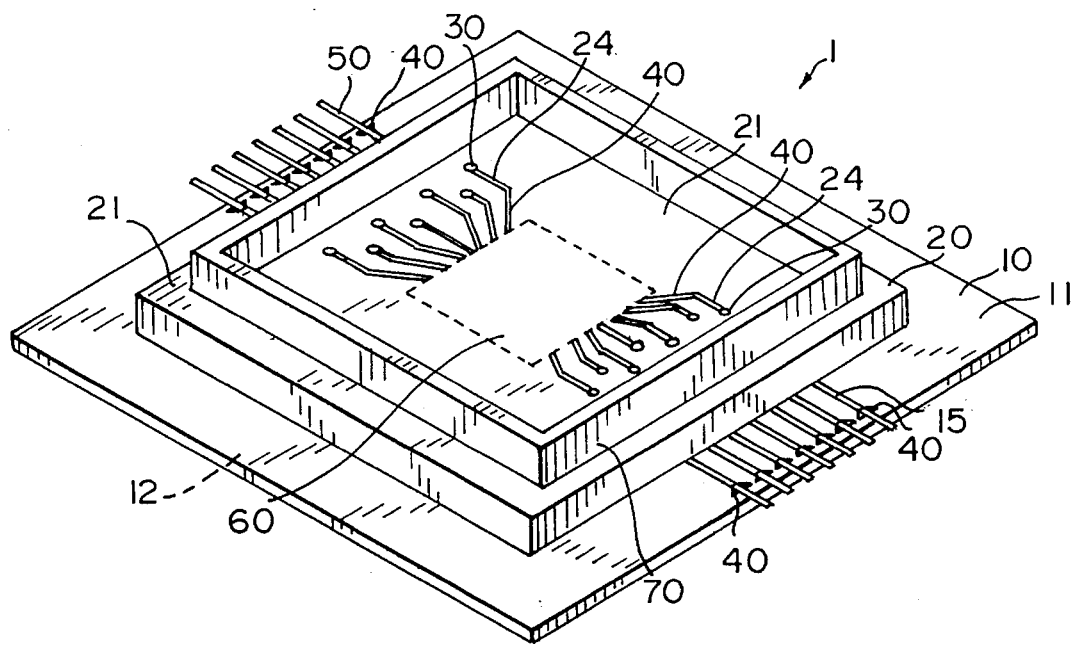
FIG. 1 illustrates a high temperature, hermetically sealable chip package containing vias of the preferred embodiment.

FIG. 1 illustrates a high temperature, hermetically sealable chip package 1 suitable for incorporating one or more vias of the preferred embodiment described herein. Chip package 1 comprises an electronic component base substrate 10, a secondary electronic component base substrate 20, a seal ring 70, and a cover 80 (not shown in FIG. 1) for placement and sealing over ring 70 thereby enclosing the interior of package 1. The term "electronic component base" as used herein refers to any component or portion of a chip package or other electronic related device, suitable for providing a mounting surface for circuitry or other structure for enclosing electronics. Base substrate 10 has an upper surface 11 and a lower surface 12. Secondary substrate 20 has an upper surface 21 and a lower surface 22 (not shown in FIG. 1). Base substrate 10 has a plurality of circuit traces 15 on upper surface 11, each trace generally extending outward from the center of substrate 10, and terminating at a bond pad 40. Conductor leads 50 provide electrical connection between circuit traces 15 and the package exterior and may be electrically connected to the respective traces 15 at bond pads 40. Secondary substrate 20 has a plurality of circuit traces 24 on upper surface 21, each trace generally extending from a bond pad 40 to a via 30. Circuit traces 24 are disposed on substrate 20 and arranged around area 60 such that electrical connection may readily be made between the chip or electronic component: and bond pads 40 on substrate 20.

Figure 2:
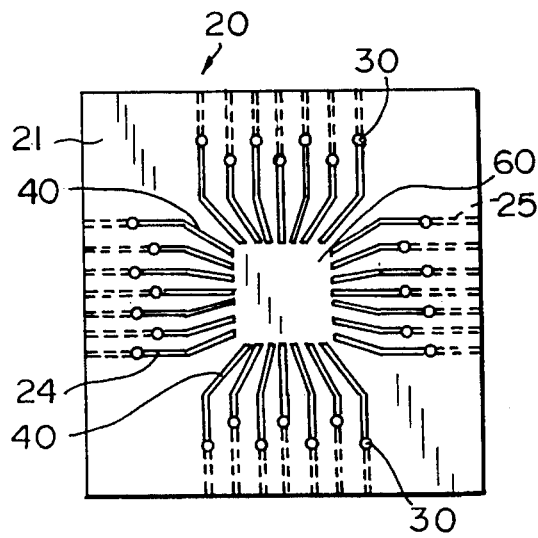
FIG. 2 illustrates the upper surface of a substrate of the chip package depicted in FIG. 1 containing circuit traces on its upper surface for providing electrical connection between a centrally mounted IC chip and a plurality of vias extending through the substrate.
Figure 3:
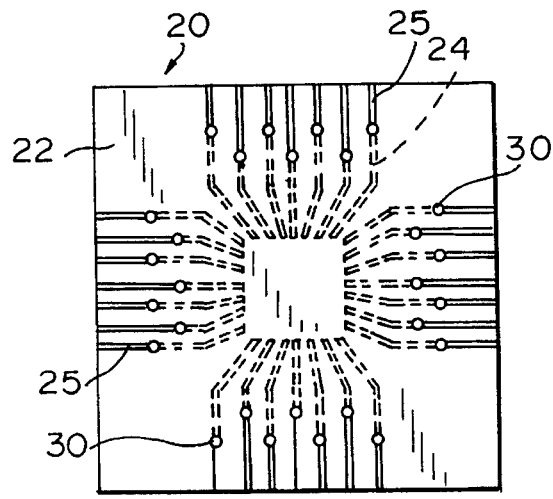
FIG. 3 illustrates the lower surface of the substrate shown in FIG. 2 and containing circuit traces on its lower surface for providing electrical connection between the plurality of vias and the outer perimeter of the substrate.

FIGS. 2 and 3 illustrate upper and lower surfaces 21 and 22 of substrate 20, respectively. As illustrated in FIGS. 2 and 3, secondary substrate 20 has a plurality of vias 30 of the preferred embodiment extending through substrate 20 and a plurality of circuit traces 24 and 25 disposed on upper and lower surfaces 21 and 22, respectively. Each via 30 is filled with an electrically conductive via fill composition, as explained in greater detail below. The vias formed in substrate 20 may be as large as is necessary depending upon the end use applications and electrical requirements of the chip and interior of package 1. The preferred diameter of vias 30 range from about 5 mils to about 25 mils, although smaller or larger diameters may be utilized. Referring to FIG. 2, circuit traces 24 disposed on upper surface 21 extend between bonding pads 40 and vias 30. After placement and affixment of an IC chip or other electronic component at area 60 in the assembled package 1, appropriate electrical connections are made between the chip and bonding pads 40. The chip or electronic component may be affixed to surface 21 by use of an adhesive such as an epoxy. Electrical connections at bonding pads 40 are preferably made by wire bonding. Referring to FIG. 3, circuit traces 25 disposed on lower surface 22 of substrate 20 generally extend from vias 30 to the perimeter of substrate 20.

FIG. 4 is a cross-sectional view of the chip package depicted in FIG. 1 further comprising cover 80. Chip package 1 comprises base substrate 10, secondary substrate 20 defining a plurality of vias 30 extending through its thickness, and seal ring 70. Disposed on upper surface 11 of base substrate 10 are circuit traces 15, bonding pads 40, and conductor leads 50. Disposed on lower surface 22 of secondary substrate 20 are circuit traces 25 each extending from a via 30 to the outer edge of substrate 20. The arrangement of circuit traces 15 and 25 on surfaces 11 and 22, respectively, is such that when surfaces 11 and 22 are placed in opposing relationship during assembly of package 1, traces 15 and traces 25 are in electrical contact. Preferably, traces 15 and 25 are in electrical contact across the entire length of traces 25. Disposed on upper surface 21 of substrate 20 are circuit traces 24 each extending between via 30 and bond pad 40. Disposed on surface 21 is seal ring 70. Affixed to ring 70, and forming package interior 65, is cover 80. FIG. 5 is an exploded view of chip package 1 and further illustrates the package construction.

Base substrate 10 and secondary substrate 20 may be formed from nearly any suitable substrate material. Typically such substrates are dielectric materials. Examples of substrate materials include, but are not limited to ceramics such as silicon nitride $Si_3N_4$, aluminum nitride AlN, and aluminum oxide $Al_2O_3$. In addition, a variety of other materials may be employed such as carbide materials. The preferred material for use as substrates 10 and 20 is a nitride-based ceramic such as aluminum nitride.

Seal ring 70 is affixed to upper surface 21 of substrate 20, preferably by seal 26 comprising an active braze material. Seal ring 70 may be formed from nearly any suitable material such as molybdenum or KOVAR. KOVAR is an iron-nickel-cobalt alloy and is available from Westinghouse Electrical Corporation. The selection of material for seal ring 70 is generally dependent upon the material employed for substrate 20. When utilizing aluminum nitride for substrate 20, the preferred material for seal ring 70 is molybdenum. Although the size of seal ring 70 may vary, the dimensions of seal ring 70 should be sufficient to provide adequate package interior volume to enclose the IC chip or electronic component. Cover 80 may be formed from an assortment of materials such as those known in the art.

Prior artisans have described hermetically sealed chip packages such as in "Highly Thermal Conductive AlN PGA Package", Shibuya et al, IMC 1992 Proceedings, Yokohama, Jun. 3 to Jun. 5, 1992, pages 285–290; "AlN Thick Film Metalized Substrate", Watabe et al, IMC 1992 Proceedings, Yokohama, Jun. 3 to Jun. 5, 1992, pages 349–354; and a previous work by the present inventor, "An Aluminum Nitride Package For 300° C. Operation", presented at the 1993 proceedings of the 43rd Electronic Components and Technology Conference, Electronic Components and Technology Conference 1993, published by IEEE, pages 431–435, by T. R. Bloom; all of which are herein incorporated by reference.

The preferred via fill compositions when appropriately deposited in a via hole, provide a hermetic seal with the substrate or base. The preferred fill compositions provide hermeticity over a wide range of temperatures and at elevated temperatures. Hermeticity between fill composition and substrate is maintained even after cooling from prior exposure to elevated temperatures. Although not wishing to be bound to any particular theory, it is believed that the surprising and unexpected ability of the preferred fill compositions to provide hermeticity subsequent to and during exposure to such high temperatures and accompanying temperature fluctuations stems from the malleability of the fill compositions. The preferred via fill compositions have sufficient malleability to accommodate dimensional changes which occur in both substrate and fill composition as a result of temperature changes, and in particular, to accommodate the differences between such changes. By having sufficient malleability, the fill compositions are able to deform to relieve material stresses resulting from temperature effects which may exist in one or both substrate and fill composition. However, malleability of the compositions is such that the compositions do not overly deform when accommodating thermal expansion or contraction effects, which would otherwise result in a loss of hermeticity.

The via fill compositions of the preferred embodiment comprise one or more appropriate metals, one or more active agents and, though not essential, an organic vehicle. The term "appropriate metal" as used herein refers to one or more metals having a particular combination of properties relating to softness and malleability. The appropriate metal(s) should have sufficient softness and malleability such that when incorporated into the via fill composition, formed into a via hole and fired, the via fill composition is capable of deforming to accommodate dimensional changes of the substrate which occur as a result of temperature changes of the substrate and via fill composition. In addition, it is also necessary that the appropriate metal(s) have sufficient softness and malleability such that in the event that material stresses are induced in either or both substrate and via fill composition as a result of temperature fluctuations or the like, the via fill composition containing the appropriate metal(s) does not crack or produce other defects. Examples of appropriate metals which may be used include but are not limited to gold, silver and corresponding alloys. In addition, mixtures of these metals, corresponding alloys, and/or other materials which have similar combinations of the above described properties may be employed. The preferred metal is silver.

The concentration of the appropriate metal(s) utilized in the via fill compositions depends upon the thermal expansion properties of the substrate, the electrical characteristics desired of the via fill composition, and processing and economic considerations. However, the amount employed should be "an effective amount" so that the resulting via fill composition is capable of deforming to accommodate the dimensional changes of the substrate induced by temperature effects. Typically, this amount is from about 90% to about 99.99% based upon the total weight of the metal and active agent.

The concentration of the active agent is between about 0.01% and about 10% based upon the total weight of the metal and active agent. Nearly any active agent, including materials which decompose upon firing to yield the desired active agent, may be utilized in the via fill compositions described herein. Two informative works on active agents are, "Principles of Soldering and Brazing", Humpston, G. and Jacobson, D., ASM Int., page 164, 1993; and "Brazing", Schwartz, M., ASM Int., page 120, 1987, which are herein incorporated by reference. Particular examples of the active agents which may be used include but are not limited to titanium, hafnium, zirconium and corresponding hydrides. In addition, mixtures of any of the active agents and corresponding hydrides may be utilized.

The concentration of the organic vehicle is such that when the components forming the via fill composition are added together and mixed, a paste-like consistency is obtained. The organic vehicle is typically any common organic screen printing vehicle known in the art, however, the vehicle selected should be an "inert firing vehicle". That is, when the via fill composition is fired, the organic vehicle should leave minimal carbon residue which could otherwise adversely affect the via fill composition. It will be recognized that a wide array of organic vehicles may be utilized in the via fill compositions described herein. One class of suitable vehicle materials are nitrogen fireable screening agents known to those skilled in the art. Representative examples of such screening agents include compositions comprising a polymeric component selected for the products resulting from its decomposition, one or more solvents, and optionally, one or more surfactants or wetting agents. An example of a suitable vehicle for use in the via fill compositions described herein, comprises about 9% ELVACITE 2045, an acrylic, available from Du Pont; about 77% pine oil available from Hercules Yarmore under the designation No. 302; and about 14% of a wetting agent available from GAF Chemicals under the designation IGEPAL CO-430 surfactant.

In forming the via fill compositions described herein, it is preferred to utilize reagent grade metal(s) and active agent(s) in a fine powdered form, that is having a particle diameter less than from about 1 micron to about 50 microns. It is generally preferred to utilize relatively small particles of the active agent to promote dispersion of the agent throughout the via fill composition. The via fill compositions are generally formed by combining the powdered metal(s) and active agent(s) with the organic vehicle and mixing until a pasty consistency is obtained. In some instances, it may be preferable to subject the resulting via fill composition to further grinding or other processing operations.

The selection of the appropriate metal for the via fill composition depends upon the application and end use requirements of the via. Silver-based via fill compositions are preferred for relatively high current or high power applications where high conductivity is desired. Gold-based via fill compositions are well suited for high temperature applications. Moreover, gold-based via fill compositions are chemically very stable.

Via holes may be formed in a substrate in a variety of fashions such as by numerical punching, laser machining, drilling, or combinations thereof. Alternatively, via holes may be formed in the substrate during manufacturing of the substrate itself. The interior walls of vias formed in substrates may be machined or otherwise processed to obtain particular surface characteristics. However, it has been found that the via fill compositions of the preferred embodiments describe herein may be utilized in conjunction with a wide variety of via wall finishes, via geometries or surface configurations.

Vias 30 may be formed in chip package i as follows. The via fill composition is pressed into via holes provided in substrate 20 using a doctor blade or squeegee from one side of substrate 20 until the composition exits the via hole on the other side. After filling via holes with the via fill composition, substrate 20 is dried at approximately 120° C. After drying, excess via fill composition is wiped from both upper surface 21 and lower surface 22 of substrate 20. It is preferred to ensure that vias 30 are adequately packed with electrically conductive via fill composition. This may be accomplished by insertion and tamping with a fine tipped instrument such as a number 8 reamer into each via 30 provided in substrate 20. Any voids which result from insertion of the instrument are then filled with additional via fill composition. The amount of via fill composition deposited in each via 30 from upper surface 21 of substrate 20 should be an amount such that a small mound or dome is formed above the via opening. Moreover, the dome or mound of via fill composition should cover the opening of the via and extend beyond the perimeter of the via to contact an end of a corresponding circuit trace 24 or 25. The assembly is then dried at about 120° C. This procedure is repeated for lower surface 22 of substrate 20, that is using a reamer to push into each via 30, formation of domes above each via, followed by drying. The via holes may also be filled with the via fill composition by drawing the paste-like composition into the via hole by means of a vacuum applied at an opening of the hole. Any other known method may be used.

Firing of the via and fill composition is performed in a substantially oxygen-free environment such as argon, nitrogen or in a vacuum. A preferred firing environment is argon with an impurity or oxygen level of less than about 4 ppm. Argon is generally preferred as it effectively functions as a wash gas for the components being fired, and since it readily displaces water vapor which is often generated during firing of the components. It is envisioned that firing could also be performed in a suitable nitrogen environment or in vacuum. Firing is performed by heating the substrate and via fill composition to a temperature which is greater than the melting point of the via fill composition. During firing of chip package 1, it is preferred to clamp ring 70 to substrate 20, or to place a weight on the stacked assembly during firing. It is most preferred to place the substrate and other components to be fired on a molybdenum "setter" or fixture covered with a titanium lid. Although not wishing to be bound to any particular theory, it is believed that the molybdenum setter and titanium cover act as oxygen collectors, and minimize adverse reaction between oxygen impurities in the argon environment and the via fill composition. An example of a suitable furnace for firing is an Astro Model APF-0716-MM atmosphere furnace.

Depending upon the via fill composition utilized, the firing temperature will vary. For silver-based via fill compositions, typically a firing temperature of about 980° C. is utilized. For gold-based via fill compositions, a firing temperature of about 1300° C. is utilized. It is preferred to follow certain heating and cooling rates during firing. It is preferred that the temperature change during the initial heating phase of the firing process occur at a rate of about 50° C./min to about 100° C./min. For the cooling phase, it is preferred that the temperature change of the substrate and filled via occur at a rate of about −10° C./min to about −20° C./min, although it is envisioned that greater or lesser rates could be utilized in both heating and cooling phases. It is most preferred to follow a heating profile during firing. The preferred heating profile for firing a silver-based via fill composition is as follows: Heat from about room temperature to about 980° C. in about 10 to about 15 minutes, maintain about 980° C. for about 10 to about 15 minutes, and cool from about 980° C. to about 200° C. in about 40 to about 45 minutes.

When utilizing silver or gold for the appropriate metal in the via fill compositions described herein, electrically conductive, hermetic vias may be formed which are capable of withstanding temperatures up to about 500° C. Accordingly, hermetic enclosures utilizing such vias are now provided.

EXAMPLES

A series of vias filled with a prior art material and a via fill composition in accordance with the preferred embodiment were formed in an Al$_2$O$_3$ substrate. The via holes were generally circular in cross section and had diameters ranging from 5 mils to 25 mils. After appropriate filling, the substrates having via holes filled with the prior art material and substrates having via holes filled with the fill compositions of the preferred embodiment were fired and allowed to cool. The prior art material was a commercially available copper-silver active braze from Lucas-Milhaupt under the designation 721. The 721 material is an active braze material containing about 72% silver, 28% copper and trace amounts of titanium hydride. As explained in greater detail below, vias filled with the prior art material exhibited severe cracking along the via, generally in the relatively brittle substrate. Vias filled with the via fill composition of the preferred embodiment did not crack and exhibited excellent resistance to high temperatures and incident temperature cycling.

Figure 6:
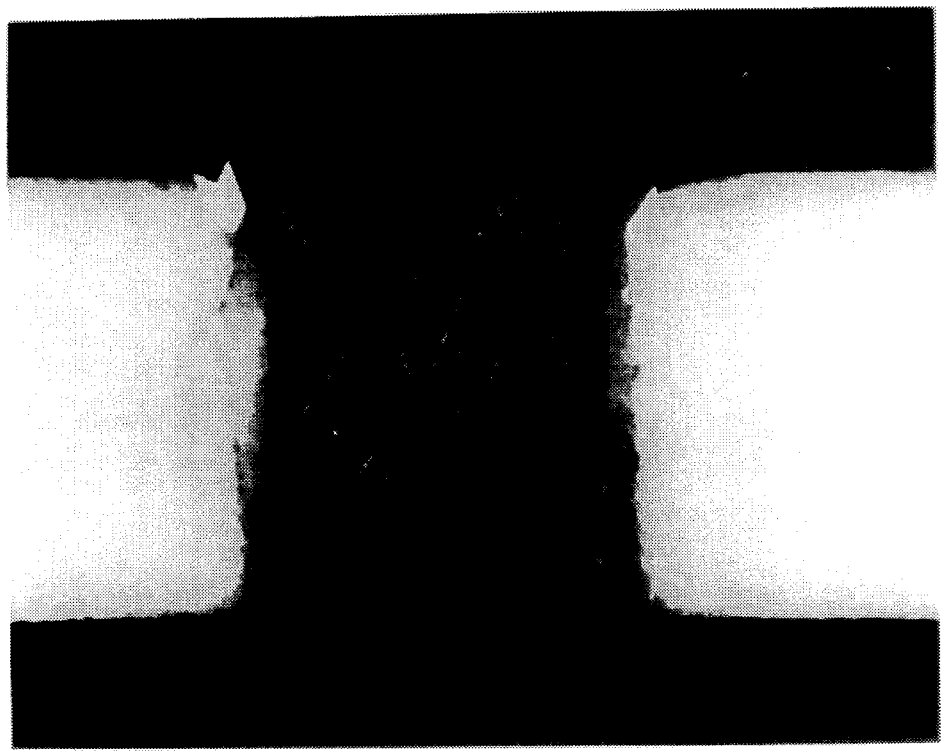
FIG. 6 is a photomicrograph of a 25 mil diameter via formed in a substrate and filled with a prior art fill material.

FIG. 6 is a photomicrograph of a 25 mil diameter via formed in an Al$_2$O$_3$ substrate, filled with the Lucas-Milhaupt 721 copper-silver active braze which was subsequently fired to a temperature of about 850° C. The arrows in the photomicrograph indicate the cracks which formed in the substrate upon cooling of the substrate and via fill material. Although not wishing to be bound to any particular theory, it is believed that the cracks result from differences in the thermal expansion properties of the substrate and via fill material, and the exceptionally strong bond between those materials. Upon cooling, the via fill material, which contracts to a greater degree than the substrate, induces stresses along the interior wall of the via, and thus in the substrate. The strong bond between the via fill material and substrate results in the substrate cracking rather than bond rupturing.

Figure 7:
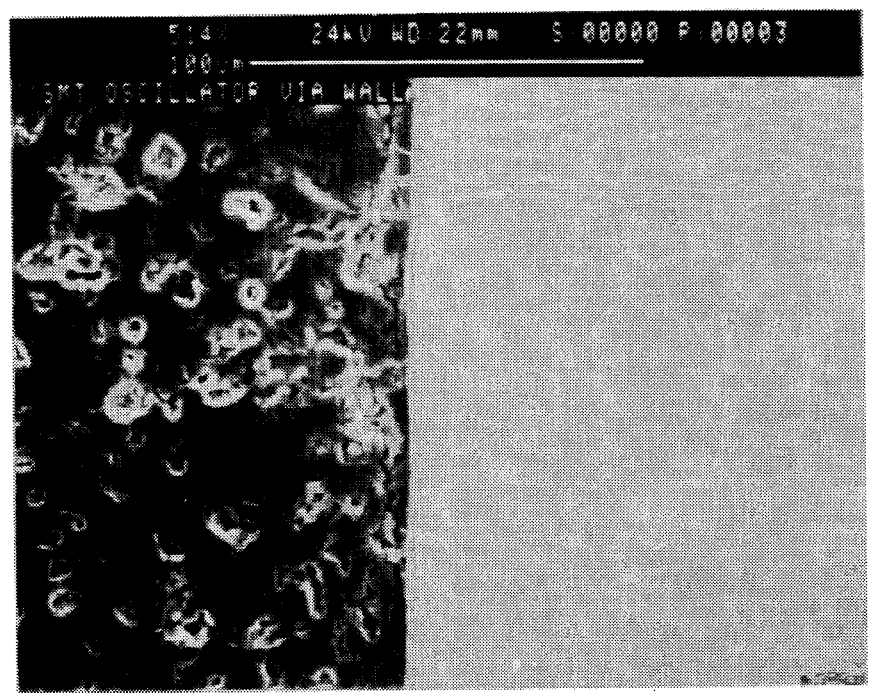
FIG. 7 is a photomicrograph of a 15 mil diameter via formed in a substrate and filled with a prior art fill material.

FIG. 7 is a photomicrograph of a 15 mil diameter via formed in an Al$_2$O$_3$ substrate and filled with the same copper-silver active braze as noted in the discussion of FIG. 6. The arrow shown in FIG. 7 indicates cracking which occurred in the substrate from temperature induced stresses.

Figure 8:
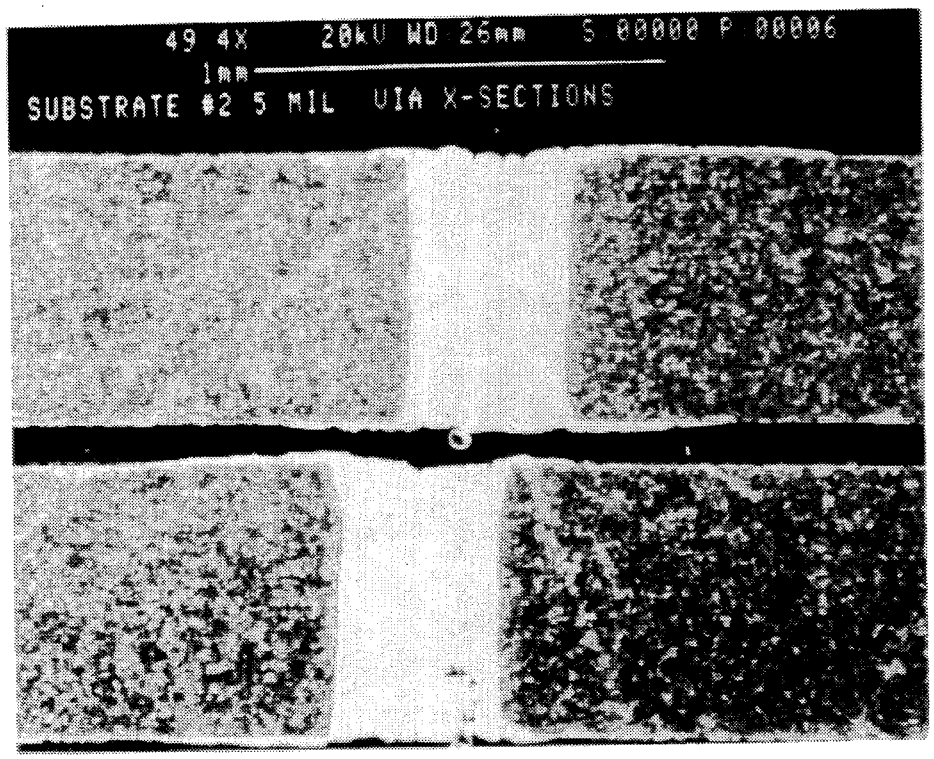
FIG. 8 is a photomicrograph of a 5 mil diameter via formed in a substrate and filled with a via fill composition in accordance with a preferred embodiment of the present invention.
Figure 9:
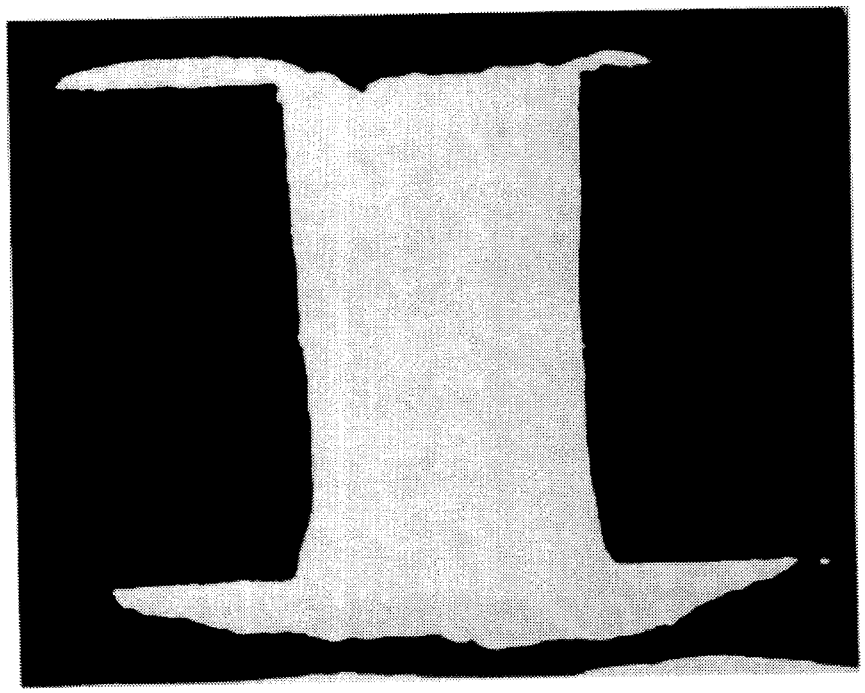
FIG. 9 is a photomicrograph of a 15 mil diameter via formed in a substrate and filled with a via fill composition in accordance with a preferred embodiment of the present invention.
Figure 10:
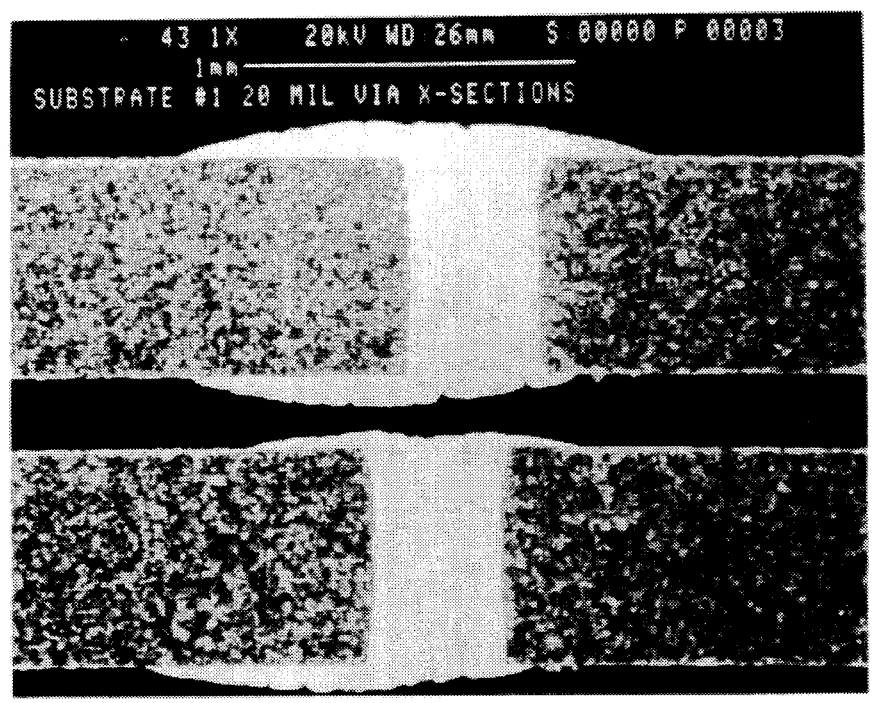
FIG. 10 is a photomicrograph of a 20 mil diameter via formed in a substrate and filled with a via fill composition in accordance with a preferred embodiment of the present invention.

In order to demonstrate the surprising and unexpected results of the via fill compositions of the preferred embodiments, a collection of substrates having vias as described below were prepared. FIGS. 8, 9 and 10 are photomicrographs of 5, 15 and 20 mil diameter vias formed in Al$_2$O$_3$ substrates and filled with a silver-based via fill composition in accordance with the preferred embodiment and fired to a temperature of 980° C. The silver-based via fill composition comprised 99% silver (expressed as a weight percentage of the total of silver and active), 1% titanium hydride as the active, and an organic vehicle in an amount so that a paste-like consistency was obtained. Upon detailed examination of the fired substrates, no evidence of cracking in the substrate or via fill composition or other failure was observed. This was quite unexpected since the same relatively brittle substrate material was utilized, same via fill procedure followed, approximately same firing temperature reached, and approximately same size vias were tested as in the tests for FIGS. 6 and 7.

Of course, it is understood that the foregoing are merely preferred embodiments of the invention and that various changes and alterations can be made without departing from the spirit and broader aspects thereof as set forth in the appended claims, which are to be interpreted in accordance with the principals of patent law, including the Doctrine of Equivalents.

The embodiments of the invention in which an exclusive property or privilege is claimed are defined as follows:

1. An electronic component base comprising:

a ceramic substrate having a first surface and a second surface and defining at least one via hole extending through the thickness of said substrate between said first surface and said second surface;

an electrically conductive fill composition disposed exclusively within said via hole and providing a hermetic seal with said substrate between said first surface and said second surface upon subsequent firing of said electronic component base, said fill composition consisting of from about 90% to about 99.99% of at least one metal selected from the group consisting of gold, silver, and combinations thereof, from about 0.01% to about 10% of at least one active agent based upon the total weight of said metal and said active agent, and an inert firing vehicle which when fired does not produce adverse amounts of carbon residue, wherein said fill composition is deposited in said via hole as a flowable paste to be subsequently fired to provide said hermetic seal.

2. The electronic component base of claim 1, wherein said active agent is selected from the group consisting of titanium, hafnium, zirconium and corresponding hydrides.

3. The electronic component base of claim 1, wherein said inert firing vehicle comprises a nitrogen fireable screening agent.

4. The electronic component base of claim 1, wherein said substrate is formed from a material selected from the group consisting of ceramics and carbides.

5. The electronic component base of claim 4, wherein said substrate is formed from a ceramic material selected from the group consisting of aluminum oxide, silicon nitride and aluminum nitride.

6. The electronic component base of claim 1, wherein said via hole is approximately circular in cross section and has a diameter of from about 5 mils to about 25 mils.

7. An electronic component base comprising:

a ceramic substrate having a first surface and a second surface and defining at least one via hole extending through the thickness of said substrate between said first surface and said second surface;

an electrically conductive fill composition disposed exclusively within said via hole, said fill composition consisting of an effective amount of a metal selected from the group consisting of gold, silver, corresponding alloys thereof, and combinations thereof, at least one active agent, and an organic vehicle, wherein said organic vehicle is an inert firing vehicle and comprises about 9% poly(n-butyl methacrylate iso-butyl methacrylate), about 77% pine oil, and about 14% nonylphenoxy poly(ethyleneoxy) ethanol.

8. The electronic component base of claim 7, wherein said effective amount of said metal is from about 90% to about 99.99% based upon the total weight of said metal and said active agent.

9. The electronic component base of claim 7, wherein said active agent is selected from the group consisting of titanium, hafnium, zirconium and corresponding hydrides.

10. The electronic component base of claim 7, wherein said active agent is in a concentration of from about 0.01% to about 10% based upon the total weight of said metal and said active agent.

11. The electronic component base of claim 7, wherein said organic vehicle comprises a nitrogen fireable screening agent.

12. The electronic component base of claim 7, wherein said via hole has an approximately circular cross section and a diameter of from about 5 mils to about 25 mils.

13. A hermetic chip package adapted for exposure to elevated temperatures without loss of hermeticity, said package comprising:

a dielectric substrate having a first outer surface and a second outer surface and defining at least one passage extending between said first surface and said second surface;

a means for hermetically enclosing a portion of said dielectric substrate; and an electrically conductive fill composition disposed exclusively within said passage, said fill composition forming a hermetic seal with said dielectric substrate between said first surface and said second surface, said fill composition capable of deforming to accommodate dimensional changes in said dielectric substrate and said fill composition without loss of hermeticity during and subsequent to exposure of said chip package to elevated temperatures, said composition consisting essentially of (i) from about 90% to about 99.99% of at least one metal selected from the group consisting of gold, silver, corresponding alloys thereof, and combinations thereof, (ii) from about 0.01% to about 10% of at least one active agent selected from the group consisting of titanium, hafnium, zirconium, corresponding hydrides, and combinations thereof, and (iii) an inert firing vehicle which when fired does not produce adverse amounts of carbon residue.

14. The chip package of claim 13, wherein said substrate is formed from a material selected from the group consisting of ceramics and carbides.

15. The chip package of claim 14, wherein said substrate is formed from a ceramic material selected from the group consisting of aluminum oxide, silicon nitride and aluminum nitride.

16. The chip package of claim 13, wherein said passage has an approximately circular cross section and a diameter of from about 5 mils to about 25 mils.

* * * * *

UNITED STATES PATENT AND TRADEMARK OFFICE
CERTIFICATE OF CORRECTION

PATENT NO. : 5,569,958
DATED : October 29, 1996
INVENTOR(S) : Terry R. Bloom

It is certified that error appears in the above-indentified patent and that said Letters Patent is hereby corrected as shown below:

On the front page in section [56] References Cited, the first patent listed "2,570,248" should have an issue date of 10/1951 not 1/1951.

Column 1, line 48, after "addition" insert --,-- (comma).

line 59, delete "el" and insert --et--.

line 64, before "That" insert --.-- (period).

Column 3, line 29, delete "component:" and insert --component--.

Column 6, line 1, before "available" insert --(poly(n-butyl methacrylate iso-butyl methacrylate))--.

line 5, after "surfactant" insert --(nonylphenoxy poly (ethyleneoxy) ethanol)--.

line 37, delete "i" and insert --1--.

Signed and Sealed this

Twentieth Day of May, 1997

Attest:

BRUCE LEHMAN

*Attesting Officer*  *Commissioner of Patents and Trademarks*